United States Patent
Adney et al.

(10) Patent No.: US 7,385,408 B1
(45) Date of Patent: Jun. 10, 2008

(54) APPARATUS AND METHOD FOR TESTING INTEGRATED CIRCUIT DEVICES HAVING CONTACTS ON MULTIPLE SURFACES

(75) Inventors: Daniel R. Adney, Phoenix, AZ (US); Rodger E. Kells, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/180,463

(22) Filed: Jul. 12, 2005

(51) Int. Cl.
*G01R 31/02* (2006.01)

(52) U.S. Cl. ...................................... 324/755
(58) Field of Classification Search ......... 324/754–755
See application file for complete search history.

(56) References Cited

U.S. PATENT DOCUMENTS

| | | | | |
|---|---|---|---|---|
| 3,874,768 | A | * | 4/1975 | Cutchaw ..................... 439/72 |
| 4,841,241 | A | | 6/1989 | Hilz et al. |
| 5,068,600 | A | | 11/1991 | Hilz et al. |
| 5,087,878 | A | * | 2/1992 | Belmore et al. ............ 324/754 |
| 5,127,837 | A | * | 7/1992 | Shah et al. .................. 439/71 |
| 5,157,325 | A | * | 10/1992 | Murphy ..................... 324/761 |
| 5,444,387 | A | | 8/1995 | Van Loan et al. |
| 5,500,606 | A | * | 3/1996 | Holmes ...................... 324/761 |
| 5,504,435 | A | * | 4/1996 | Perego ....................... 324/755 |
| 6,046,597 | A | * | 4/2000 | Barabi ........................ 324/755 |
| 6,065,986 | A | * | 5/2000 | Mizuta ....................... 439/266 |
| 6,147,505 | A | | 11/2000 | Ott et al. |
| 6,220,870 | B1 | * | 4/2001 | Barabi et al. ................ 439/71 |
| 6,297,654 | B1 | * | 10/2001 | Barabi ........................ 324/755 |
| 6,354,859 | B1 | * | 3/2002 | Barabi et al. ............... 439/331 |
| 6,743,033 | B2 | * | 6/2004 | Tateishi et al. ............. 439/266 |
| 2003/0054587 | A1 | * | 3/2003 | Cobbley et al. ............ 438/106 |

* cited by examiner

*Primary Examiner*—Ha Nguyen
*Assistant Examiner*—Roberto Velez
(74) *Attorney, Agent, or Firm*—Jeffrey D. Moy; Weiss & Moy, P.C.

(57) ABSTRACT

An apparatus and method which allows for testing a semiconductor device having contacts on multiple surfaces has a contactor assembly for holding a semiconductor device and for sending test signals from the test board to and from a first surface and a second surface of the semiconductor device. A latching device is removably coupled to the contactor assembly. The latching device is used to secure the semiconductor device to the contactor assembly and for sending test signals to and from the second surface of the semiconductor package to the contactor assembly.

19 Claims, 4 Drawing Sheets

APPARATUS AND METHOD FOR TESTING INTEGRATED CIRCUIT DEVICES HAVING CONTACTS ON MULTIPLE SURFACES

FIELD OF THE INVENTION

This invention relates to semiconductor devices and, more specifically, to an apparatus and method for the post production testing of semiconductor devices having contacts on multiple surfaces.

BACKGROUND OF THE INVENTION

The testing of an integrated circuit device is a very important step in the production of quality semiconductor devices. A number of different tests may be performed on the integrated circuit device to identify whether the circuit is operating correctly and whether or not the circuit is likely to malfunction in the future.

When testing an integrated circuit device, the integrated circuit device is placed in a test fixture. The test fixture is mounted on a device under test (DUT) board. The DUT board has contact pads that are electrically connected to the individual leads of the integrated circuit device. Electrical signal probes from the tester are brought into contact with the contact pads on the test board for coupling electrical signals to the integrated circuit device and for monitoring the signals from the integrated circuit device.

A problem arises when testing integrated circuit devices with contacts on multiple surfaces (i.e., top and bottom surfaces). Presently, testing these types of integrated circuit devices requires testing one side of the device at a time. Thus, one has to test a first side of the integrated circuit device, turn the integrated circuit device over and then test the second side. Testing integrated circuit devices with contacts on multiple surfaces in the above manner, results in increase test time and cost.

Therefore, a need existed to provide a device and method that will allow testing of semiconductor devices having contacts on multiple surfaces that overcomes the problems associated with the prior art.

SUMMARY OF THE INVENTION

An apparatus and method which allows for testing a semiconductor device having contacts on multiple surfaces has a lower contactor assembly for holding a semiconductor device and for sending test signals from the test board to and from a first surface and a second surface of the semiconductor device. A latching device is removably coupled to the lower contactor assembly. The latching device is used to secure the semiconductor device to the lower contactor assembly and for sending test signals to and from the second surface of the semiconductor package to the lower contactor assembly.

The present invention is best understood by reference to the following detailed description when read in conjunction with the accompanying drawings.

BRIEF DESCRIPTION OF THE DRAWINGS

Common reference numerals are used throughout the drawings and the detailed description to indicate like elements.

DETAILED DESCRIPTION

Figure 1:
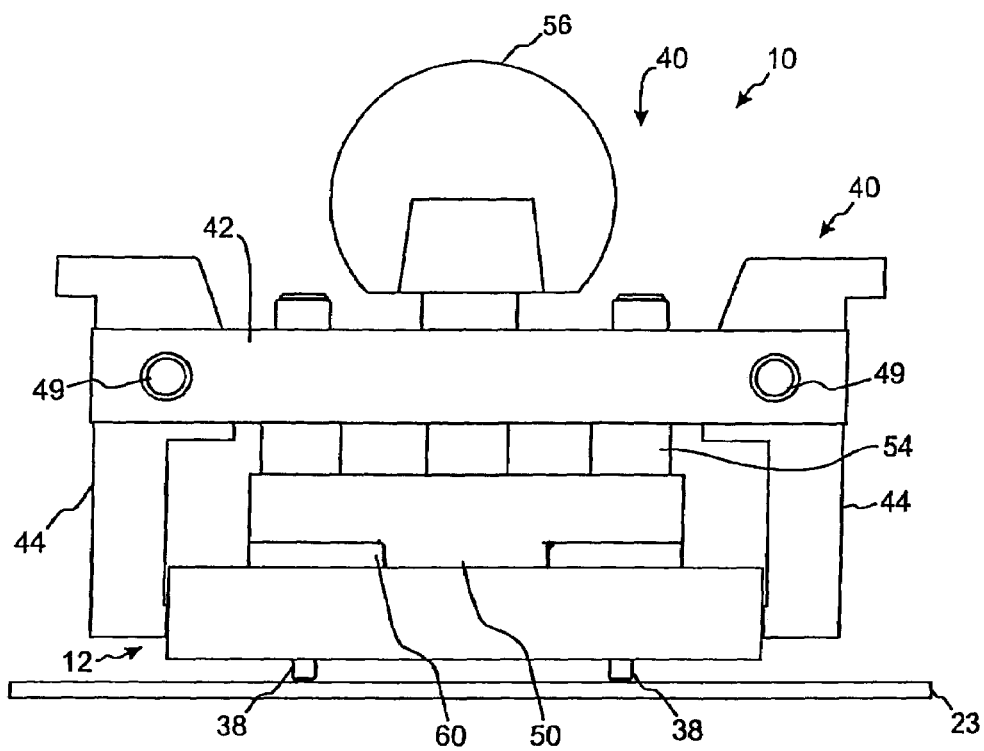
FIG. 1 is a front view of the testing fixture of the present invention.
Figure 2:
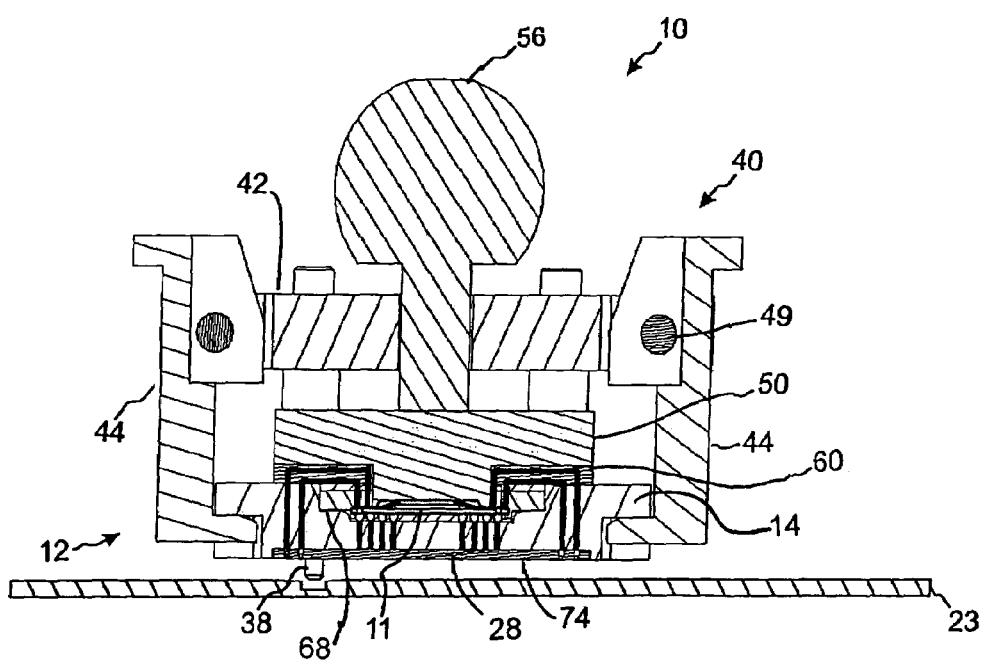
FIG. 2 is a cross-sectional front view of the testing fixture of the present invention.

Referring to FIGS. 1 and 2, a testing fixture 10 is shown. The testing fixture 10 will allow one to test a semiconductor device 11 having contacts on multiple surfaces in a single test run. Presently, testing these types of semiconductor devices 11 require testing one side of the semiconductor device 11 at a time. Thus, one has to test a first side of the semiconductor device 11, turn the semiconductor device 11 over and then test the second side.

The testing fixture 10 is comprised of a lower contactor assembly 12 and a latching device 40. The lower contactor assembly 12 is used to hold a semiconductor device 11 in the testing fixture 10. The lower contactor assembly 12 is further used to test one side of the semiconductor device 11. A latching device 40 is removably coupled to the lower contactor assembly 12. The latching device 40 secures and holds the semiconductor device 11 to the lower contactor assembly 12. The latching device 40 is further used for transferring test signals from a second surface of the semiconductor device 11.

Figure 3:
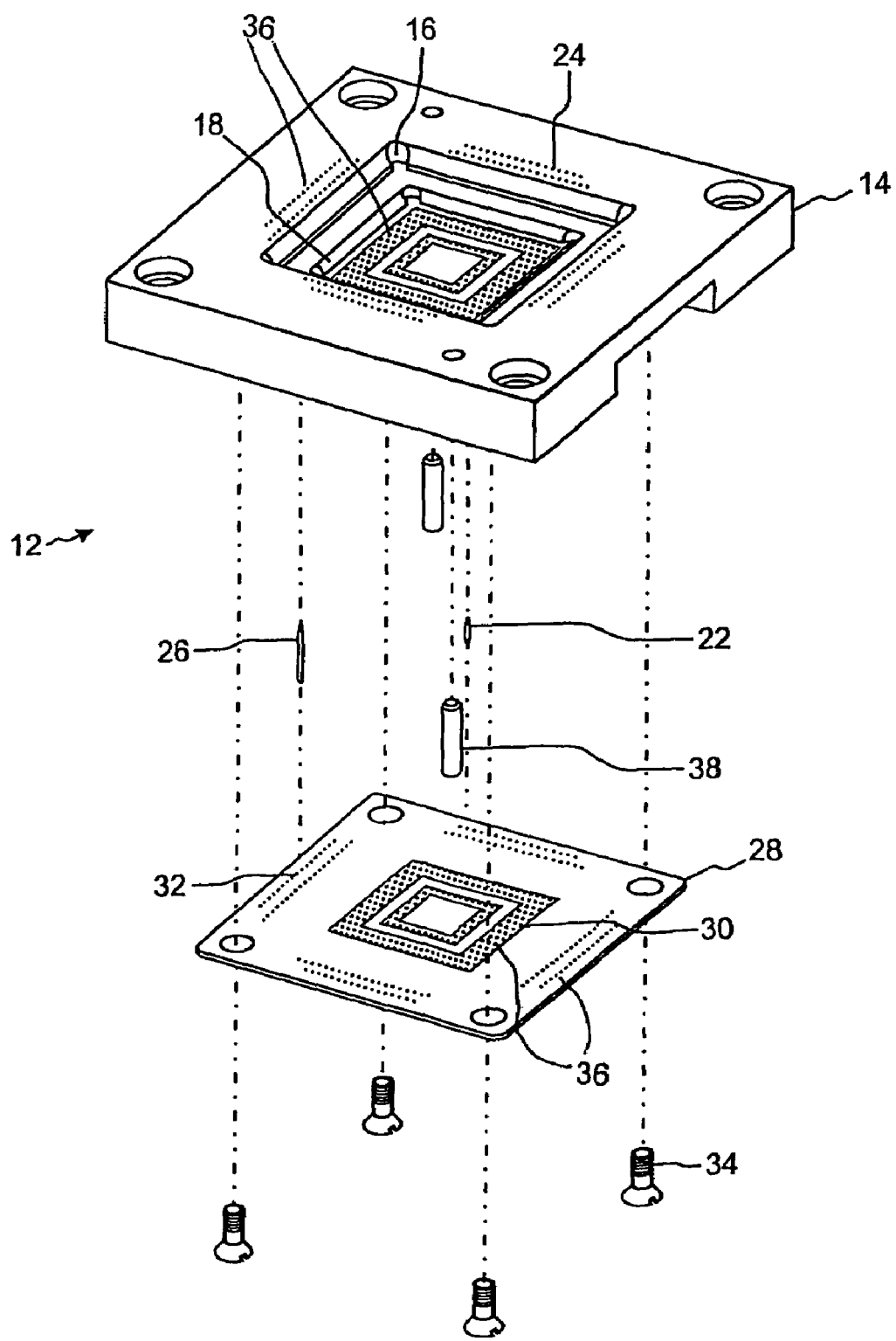
FIG. 3 is an exploded view of the bottom section of the testing fixture of the present invention.
Figure 4:
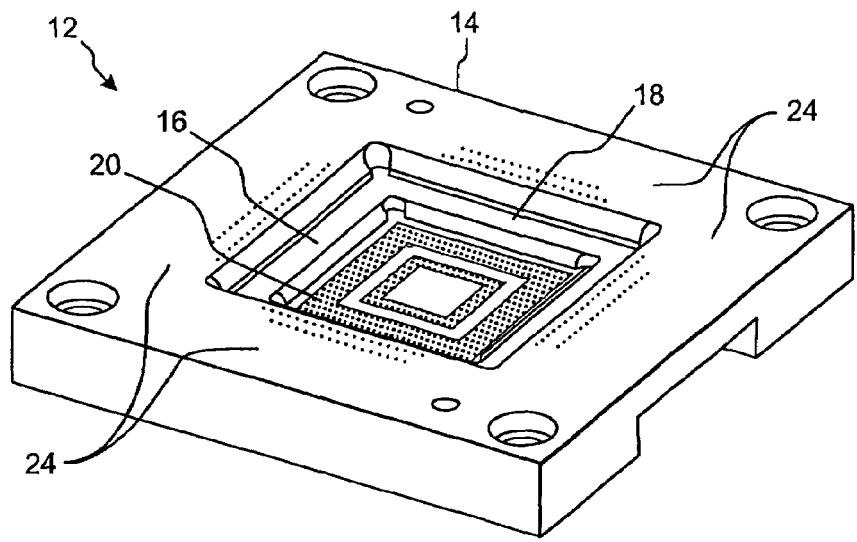
FIG. 4 is an elevated perspective view of the bottom section of the testing fixture of the present invention.

Referring to FIGS. 3 and 4, the lower contactor assembly 12 is shown in greater detail. The lower contactor assembly 12 has a base 14. The base 14 is generally made out of a lightweight non-conductive material. In general, the base 14 is made out of plastic or the like. The listing of the above should not be seen as to limit the scope of the present invention. The base 14 has a cavity 16 formed therein. The cavity 16 is generally formed in a central region of the base 14. A ridge 18 is formed around an interior section of the cavity 16. In accordance with one embodiment of the present invention, the ridge 18 extends around an entire interior perimeter of the cavity 16. The cavity 16 and ridge 18 emulate a footprint of the semiconductor device 11 to be tested.

A plurality of first channels 20 are formed in a bottom area of the cavity 16. The channels 20 are hollow passageways formed through the bottom surface of the cavity 16. The location of the channels 20 align with contacts on one side of the semiconductor device 11 when the semiconductor device 11 is placed in the cavity 16. A contact pin 22 is placed inside each channel 20. The contact pins 22 are double sided contact pins. One side of the contact pin 22 is used to make contact with the contacts on one side of the semiconductor device 11. The second end of the contact pin 22 is used to contact a test board 23 which is coupled to the testing fixture 10 via a retainer plate 28. In general, the contact pins 22 are doubled ended spring contacts.

A plurality of second channels 24 are formed around the outer perimeter of the base 14 outside of the cavity 16. The plurality of second channels 24 are hollow passageways formed through the height of the base 14. A contact pin 26 is placed inside each channel 24. The contact pins 26 are double sided contact pins. One side of the contact pin 26 is used to make contact with the second surface of the semiconductor device 11 via a contact board 60 located in the latching device 40. The second end of the contact pin 26 is used to contact a test board 23 which is coupled to the testing fixture 10 via the retainer plate 28.

The retainer plate 28 is coupled to the bottom surface of the base 14. The retainer plate 28 is used to keep the contact pins 22 and 26 in the respective channels 20 and 24. Thus, the retainer plate 28 is used to keep the contact pins 22 and 26 from falling out of the base 14. The retainer plate 28 is further used to allow the second side of the contact pins 22 and 26 to contact a test board 23 which is coupled to bottom section of the retainer plate 28 during testing of the semiconductor device 11.

The retainer plate 28 has a first plurality of contacts 30. The first plurality of contacts 30 are formed in a central area of the retainer plate. The first plurality of contacts 30 is aligned with the first channels 20 formed in a bottom area of the cavity 16. The first plurality of contacts 30 allow the second end of the contact pin 22 to contact a test board 23 which would be coupled to a bottom section of the lower contactor assembly 12. The retainer plate 28 has a second plurality of contacts 32. The second plurality of contacts 32 are formed in around the outer perimeter of the retainer plate 28. The second plurality of contacts 32 is aligned with the second channels 24 formed around the outer perimeter of the base 14 outside of the cavity 16. The second plurality of contacts 32 allow the second end of the contact pin 22 to contact a test board 23 which would be coupled to a bottom section of the lower contactor assembly 12.

The retainer plate 28 is removably coupled to the bottom surface of the base 14. Connectors 34 are used to couple the retainer plate 28 to the bottom surface of the base 14. In general, a screw or other device is used to couple the retainer plate 28 to the bottom surface of the base 14. Connector openings 36 are formed on the base 14 and through the retainer plate 28. Once the retainer plate 28 is properly aligned with the bottom surface of the base 14, the connector openings 36 on the base 14 will be aligned with a respective connector opening 36 of the retainer plate. Once the connector openings 36 are aligned, the connectors 34 are placed through the connector openings 36 to secure the retainer plate 28 to the bottom surface of the base 14.

The testing fixture 10 needs to be properly aligned with the test board 23 in order to properly test the semiconductor device 11. The retainer plate 28 may have alignment pins 38 for this reason. The alignment pins 38 are coupled to a bottom surface of the retainer plate 28. The alignment pins 38 are used to ensure proper alignment of the testing fixture 10 to the test board 23.

Figure 5:
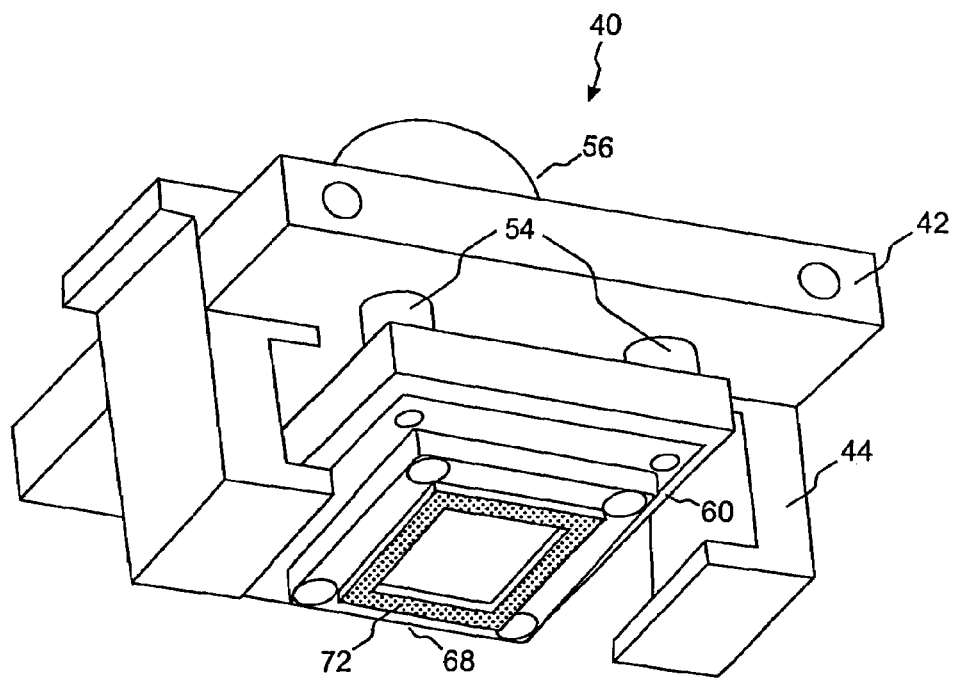
FIG. 5 is an elevated perspective view of the top section of the testing fixture of the present invention.
Figure 6:
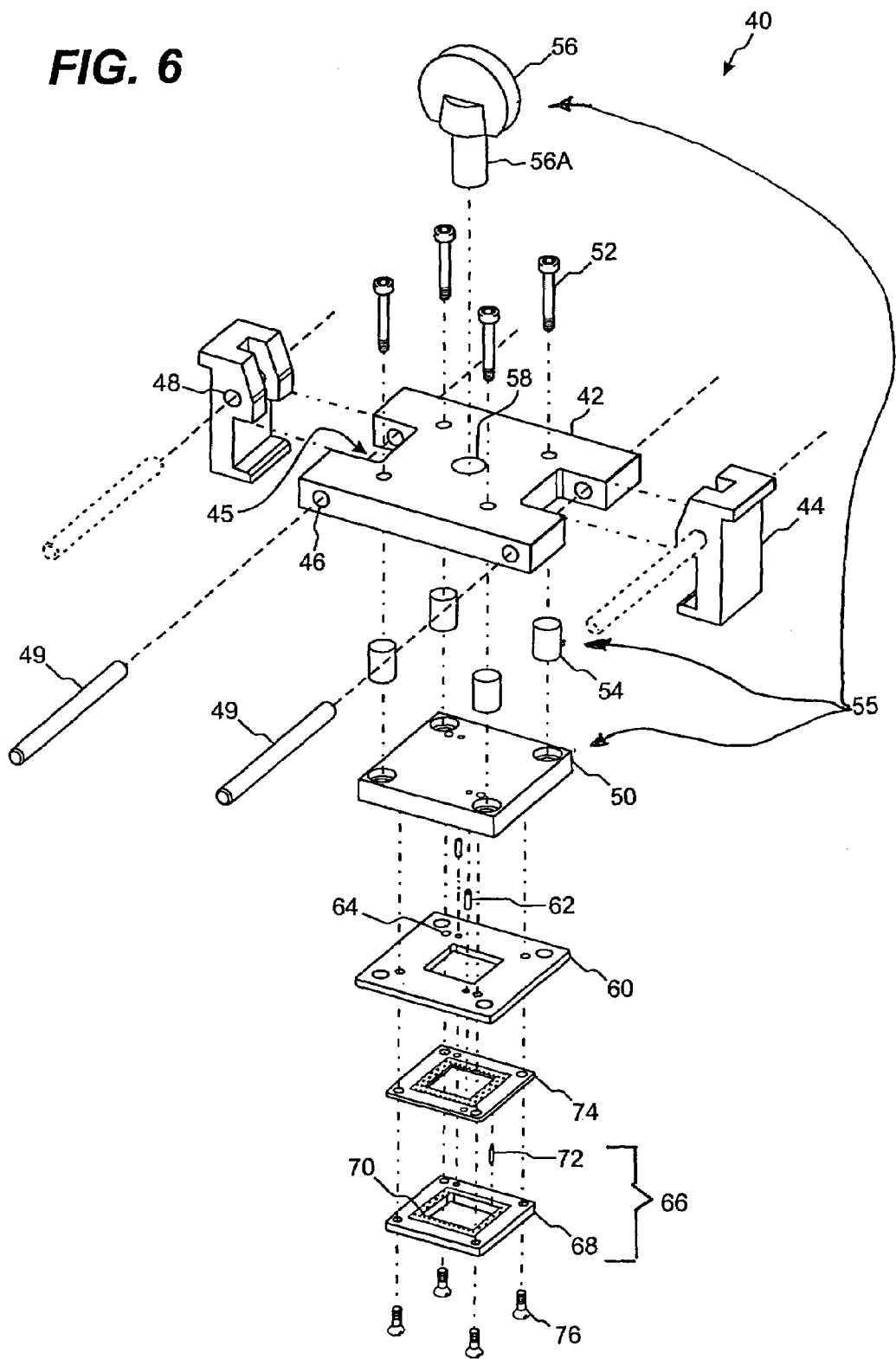
FIG. 6 is an exploded view of top section of the testing fixture of the present invention.

Referring to FIGS. 5 and 6, the latching device 40 is shown in greater detail. The latching device 40 is used to secure and hold the semiconductor device 11 to the lower contactor assembly 12. This is necessary to ensure continuity between the semiconductor device 11 and the testing fixture 10. The latching device 40 is also used for transferring test signals from a second surface of the semiconductor package to the test board 23.

The latching device 40 has a lid member 42. The lid member 42 is generally made out of a non-conductive material like plastic or the like. The above is given as an example and should not be seen as to limit the scope of the present invention. One or more latches 44 are hingedly coupled to the lid member 42. The latches 44 are used to secure the latching device 40 to the lower contactor assembly 12. In accordance with one embodiment of the present invention, the latches 44 are formed as "L" shaped members. To secure the latching device 40 to the lower contactor assembly 12, a bottom interior section of the "L" shaped member is positioned against a bottom surface of the lower contactor assembly 12.

A passageway 46 is formed through the lid member 42 for each latch 44. A corresponding passageway 48 is also formed through each latch 44. When passageways 46 and 48 are aligned, a pin 49 is inserted through the passageways 46 and 48 to hingedly coupled the latches 44 to the lid member 42. In the embodiment depicted in the Figures, the lid member 42 has slots 45 formed on opposite sides of the lid member 42. The slots 46 allow for the latches 44 to have a greater range of motion to more easily secure the latching device 40 to the lower contactor assembly 12.

A tension device 55 is coupled to the lid member 42. The tension device 55 is used to ensure constant contact on the semiconductor device 11 under test. The tension device 55 is comprised of a spacer 50. The spacer 50 is coupled to the lid member 42. A plurality of pin members 52 are used to couple the spacer 50 to the lid member 42. One or more springs 54 are positioned between the lid member 42 and the spacer 50. A knob 56 is coupled to the lid member 42. The knob 56 is used to adjust the tension of the springs 54 and therefore the pressure that the tension device 55 places on the semiconductor device 11. In accordance with one embodiment of the present invention, the lid member 42 has a threaded opening 58 formed there through. The knob 56, having a threaded leg member 56A, is rotationally coupled to the threaded opening 58. By rotating the knob 56, one may adjust the tension the spacer 50 exerts on the semiconductor device 11.

A contact board 60 is coupled to a bottom surface of the spacer 50. In accordance with one embodiment of the present invention, the contact board 60 is a printed circuit board. The contact board 60 is used for transferring signals from the second surface of the semiconductor device 11 to the lower contactor assembly 12. The contact board 60 emulates the contact points of the second surface of the semiconductor device 11. The contact board 60 then transfers the signals out to a pattern outside of the semiconductor device footprint. In order to properly align the contact board 60, one or more alignment pins 62 are coupled to a bottom surface of the spacer 50. The contact board 60 will also have one or more corresponding alignments openings 64. By placing the contact board 60 onto the bottom surface of the spacer 50 so that the alignments pins 62 are placed through the alignment openings 64, the contact board 60 will be properly aligned.

An upper contactor assembly 66 is coupled to the contact board 60. The upper contactor assembly 66 is used to provide contact between contacts on the second surface of the semiconductor device 11 and the contact board 60. The upper contactor assembly 66 has a contact block 68. The contact block 68 will have a plurality of channels 70 formed through the contact block 68. The channels 70 are hollow passageways formed through the contact block 68. The location of the channels 70 align with contacts on the second surface of the semiconductor device 11 when the semiconductor device 11 is placed in the testing fixture 10. A contact pin 72 is placed inside each channel 70. The contact pins 72 are double sided contact pins and provide a pathway for signals to and from the second side of the semiconductor device 11 and the contact board 60. A retainer block 74 is coupled to the contact block 68 to secure the contact pins 72 in the contact block 68. One or more screws 76 are used to couple the retainer block 74 to the contact block 68.

In operation, the semiconductor device 11 is placed in the cavity 16 formed in the base 14 of the lower contactor assembly 12. The contact pins 22 and 26 are used to couple the test board 23 which is coupled to the bottom section of the retainer plate 28 to the first and second surface of the semiconductor device 11. Once the device is placed in the cavity 16, the latching device 40 is coupled to the lower contactor assembly 12. A bottom interior section of each latch 44 is positioned against a bottom surface of the lower contactor assembly 12 to secure the latching device 40 to the lower contactor assembly 12. A tension device 55 is then used to ensure constant contact on the semiconductor device 11 under test. By rotating the knob 56 one may adjust the tension the spacer 50 exerts on the semiconductor device 11. Electrical signal probes from a tester are brought into contact with contact pads on the test board 23. Electrical signals are sent to and from the first and second sides of the semiconductor device 11 via the contact pins 22 and 26. Thus, the testing fixture 10 will allow one to test a semiconductor device 11 having contacts on multiple surfaces in a single test run.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An apparatus for testing a semiconductor device having contacts on multiple surfaces comprising:
    a lower contactor assembly for holding a semiconductor device and for sending test signals to and from a plurality of contacts on a bottom surface of the semiconductor device; and
    a removable latching device electrically coupled to the lower contactor assembly and to a plurality of contacts on a top surface of the semiconductor device, wherein the removable latching device secures the semiconductor device to the lower contactor assembly and sends test signals to and from the plurality of contacts on the top surface of the semiconductor device, wherein the removable latching device comprises:
    a lid member;
    at least one latch hingedly coupled to the lid member to secure the removable latching device to the lower contactor assembly; and
    a tension device coupled to the lid member for adjusting a pressure placed on the semiconductor device, wherein the tension device comprises:
        a spacer coupled to the lid member;
        at least one spring positioned between the lid member and the spacer; and
        a knob coupled to the lid member to adjust a tension of the spring.

2. An apparatus for testing a semiconductor device having contacts on multiple surfaces in accordance with claim 1 wherein the lower contactor assembly comprises:
    a base having a cavity for holding the semiconductor device to be tested;
    a plurality of channels extending through the base; and
    a plurality of contact pins, wherein a contact pin is positioned inside each of the plurality of channels, the plurality of contact pins sending test signals to and from the plurality of contacts on the bottom surface and the plurality of contacts on the top surface of the semiconductor device.

3. An apparatus for testing a semiconductor device having contacts on multiple surfaces in accordance with claim 2 wherein the lower contactor assembly further comprises a retainer plate coupled to a bottom surface of the base for keeping the plurality of contact pins inside each of the plurality of channels.

4. An apparatus for testing a semiconductor device having contacts on multiple surfaces in accordance with claim 3 further comprising alignment pins coupled to a bottom surface of the retainer plate to align the apparatus to a test board.

5. An apparatus for testing a semiconductor device having contacts on multiple surfaces in accordance with claim 2 wherein the cavity has a ridge extending around an interior perimeter of the cavity, the cavity and the ridge emulating a footprint of the semiconductor device.

6. An apparatus for testing a semiconductor device having contacts on multiple surfaces in accordance with claim 2 wherein the base is made of a non-conductive material.

7. An apparatus for testing a semiconductor device having contacts on multiple surfaces in accordance with claim 2 wherein the plurality of channels comprises:
    a plurality of first channels formed in a bottom area of the cavity; and
    a plurality of second channels formed around an outer perimeter of the base outside of the cavity.

8. An apparatus for testing semiconductor device having contacts on multiple surfaces in accordance with claim 7 wherein the plurality of contact pins comprises:
    a first plurality of contact pins, wherein one of the first plurality of contact pins is placed inside each of the plurality of first channels, the first plurality of contact pins sending test signals to and from the plurality of contacts on the bottom surface of the semiconductor device; and
    a second plurality of contact pins, wherein one of the second plurality of contact pins is placed inside each of the plurality of second channels, the second plurality of contact pins sending test signals to and from the removable latching device coupled to the plurality of contacts on the top surface of the semiconductor device.

9. An apparatus for testing a semiconductor device having contacts on multiple surfaces in accordance with claim 1 wherein the lower contactor assembly comprises:
    a base having a cavity formed therein;
    a ridge extending around an interior perimeter of the cavity, the cavity and the ridge emulating a footprint of the semiconductor device for holding the semiconductor device;
    a plurality of first channels formed in a bottom area of the cavity and extending through the base;
    a plurality of second channels formed around an outer perimeter of the base outside of the cavity and extending through the base;
    a first plurality of contact pins, wherein one of the first plurality of contact pins is placed inside each of the plurality of first channels, the first plurality of contact pins sending test signals to and from the bottom surface of the semiconductor device;
    a second plurality of contact pins, wherein one of the second plurality of contact pins is placed inside each of the plurality of second channels, the second plurality of contact pins sending test signals to and from the removable latching device coupled to the top surface of the semiconductor device; and a retainer plate coupled to a bottom surface of the base for keeping the first plurality of contact pins and the second plurality of contact pins inside the base.

10. An apparatus for testing a semiconductor device having contacts on multiple surfaces in accordance with claim 1 wherein the removable latching device further comprises:
 a contact board coupled to a bottom surface of the tension device for transferring signals from the top surface of the semiconductor device to the lower contactor assembly; and
 an upper contactor assembly coupled to the contact board, the upper contactor assembly for transferring test signals to and from the top surface of the semiconductor device to the contact board.

11. An apparatus for testing a semiconductor device having contacts on multiple surfaces in accordance with claim 10 wherein the upper contactor assembly comprises:
 a contact block having a plurality of channels formed there through, the plurality of channels aligned with contacts on the top surface of the semiconductor device;
 a plurality of contact pins, wherein one of the plurality of contact pins is placed inside each of the plurality of channels; and
 a retainer block coupled to the contact block to secure the plurality of removable latching device contact pins in the contact block.

12. An apparatus for testing a semiconductor device having contacts on multiple surfaces in accordance with claim 1 wherein the lid member has a slot formed on opposing sides for coupling the at least one latch to the lid number.

13. An apparatus for testing a semiconductor device having contacts on multiple surfaces accordance with claim 1 wherein the tension device further comprises:
 a threaded opening formed through the lid member;
 a threaded leg member extending down from the knob wherein the threaded leg member is rotationally coupled to the threaded opening to adjust the pressure placed on the semiconductor device.

14. An apparatus for testing semiconductor device having contacts on multiple surfaces in accordance with claim 1 wherein the removable latching device further comprises at least one alignment pin coupled to a bottom surface of the spacer to properly align a contact board.

15. An apparatus for testing a semiconductor device having contacts on multiple surfaces comprising: means for holding a semiconductor device and for sending test signals to and from a bottom surface of the semiconductor device; and means for latching electrically coupled to the means for holding a semiconductor device and to a top surface of the semiconductor device, wherein the means for latching secures the semiconductor device to the means for holding a semiconductor device and sends test signals to and from a top surface of the semiconductor device, wherein the means for latching comprises: a lid member; at least one latch hingedly coupled to the lid member to secure the removable latching device to the lower contactor assembly; and a tension device coupled to the lid member for adjusting a pressure placed on the semiconductor device, wherein the tension device comprises: a spacer coupled to the lid member; at least one spring positioned between the lid member and the spacer; and a knob coupled to the lid member to adjust a tension of the spring.

16. An apparatus for testing a semiconductor device having contacts on multiple surfaces in accordance with claim 15 wherein the means for holding comprises:
 a base having a cavity for holding the semiconductor device;
 a plurality of channels extending through the base; and
 means for transferring the test signals to and from the bottom surface and the top surface of the semiconductor device.

17. An apparatus for testing a semiconductor device having contacts on multiple surfaces in accordance with claim 15 wherein the means for holding a semiconductor device comprises:
 a base having a cavity for holding the semiconductor device to be tested;
 a plurality of channels extending through the base; and
 a plurality of contact pins, wherein a contact pin is positioned inside each of the plurality of channels, the plurality of contact pins sending test signals to and from the plurality of contacts on the bottom surface and the plurality of contacts on the top surface of the semiconductor device.

18. An apparatus for testing a semiconductor device having contacts on multiple surfaces in accordance with claim 17 wherein the means for holding a semiconductor device further comprises a retainer plate coupled to a bottom surface of the base for keeping the plurality of contact pins inside each of the plurality of channels.

19. An apparatus for testing a semiconductor device having contacts on multiple surfaces in accordance with claim 15 wherein the lid member has a slot formed on opposing sides for coupling the at least one latch to the lid member.

* * * * *